US009285395B2

United States Patent
Hall

(10) Patent No.: US 9,285,395 B2
(45) Date of Patent: Mar. 15, 2016

(54) SYNCHRONIZER FOR A DATA ACQUISITION SYSTEM

(75) Inventor: Nelson Hall, Kent, WA (US)

(73) Assignee: CableWISE Techimp Limited, London (GB)

( * ) Notice: Subject to any disclaimer, the term of this patent is extended or adjusted under 35 U.S.C. 154(b) by 662 days.

(21) Appl. No.: 12/605,964

(22) Filed: Oct. 26, 2009

(65) Prior Publication Data

US 2010/0250159 A1 Sep. 30, 2010

Related U.S. Application Data

(60) Provisional application No. 61/165,333, filed on Mar. 31, 2009.

(51) Int. Cl.
*G01R 13/02* (2006.01)
*G01R 31/12* (2006.01)
*G01R 31/14* (2006.01)

(52) U.S. Cl.
CPC ........ *G01R 13/0254* (2013.01); *G01R 31/1272* (2013.01); *G01R 31/14* (2013.01)

(58) Field of Classification Search
CPC ........... G01R 31/1272; G01R 31/1227; G01R 31/343; G01R 15/14; G01R 31/083; G01R 31/12; G01R 13/0254; G01R 21/006; G01R 31/021; G01R 31/088; G01R 31/1245; G01R 31/14; H04B 2203/5495; H04B 3/54; G06F 17/148; G06F 17/18
USPC .................................................... 702/60, 59
See application file for complete search history.

(56) References Cited

U.S. PATENT DOCUMENTS

| 3,549,874 | A | * | 12/1970 | Vachitis | 708/834 |
| 5,090,389 | A | * | 2/1992 | Oota | 123/685 |
| 5,117,191 | A | * | 5/1992 | Saigo et al. | 324/551 |
| 6,313,640 | B1 | * | 11/2001 | Nasrallah et al. | 324/536 |
| 6,545,485 | B1 | * | 4/2003 | Sanderson | 324/536 |
| 7,532,012 | B2 | * | 5/2009 | Cern | 324/536 |
| 8,126,664 | B2 | * | 2/2012 | Fournier et al. | 702/59 |
| 2008/0309351 | A1 | * | 12/2008 | Stewart et al. | 324/551 |

OTHER PUBLICATIONS

Patent Examination Report No. 1, mailed Apr. 28, 2014, issued in related Australian Application No. 2009230778, filed Oct. 26, 2009, 4 pages.

* cited by examiner

*Primary Examiner* — Alexander Satanovsky
(74) *Attorney, Agent, or Firm* — Christensen O'Connor Johnson Kindness PLLC

(57) ABSTRACT

A data acquisition system is provided that in one example comprises a sensor electrically coupled to a data acquisition unit via a signal splitter. In use, the sensor senses one or more signals transmitted over a "live" power cable carrying, for example, 50 Hz or 60 Hz, medium voltage power. The one or more signals are then transmitted to the data acquisition unit to be stored, displayed, and/or analyzed. The data acquisition system includes a synchronizer that allows the data acquisition unit to synchronize the storage of the sensed signals to the frequency of the power transmitted over the tested power cable or system. In one embodiment, the synchronizer provides an accurate phase angle reference or trigger signal for accurate phase resolved data acquisition and testing.

19 Claims, 7 Drawing Sheets

SYNCHRONIZER FOR A DATA ACQUISITION SYSTEM

CROSS-REFERENCE TO RELATED APPLICATION

The present application claims the benefit of U.S. Provisional Patent Application No. 61/165,333, filed Mar. 31, 2009, which is hereby expressly incorporated by reference.

BACKGROUND

It has been shown that defects, such as the presence of faults, discharges, etc., lead to catastrophic failure of power equipment, including medium voltage power cables, switchgears, distribution blocks, electric motors, transformers, etc. One particularly type of defect that causes an abnormal amount of power equipment failure relates to internal discharges, known as partial discharge (PD). As generally known in the art, partial discharge can occurs within an insulation medium, such as the insulation layer of a medium voltage power cable, an insulation component, e.g., bushing, etc., of a transformer, switchgear, etc. In time, partial discharge, left unattended, may significantly deteriorate the insulation medium along with a combination of other factors such as thermal cycling, mechanical fatigue, embrittlement, and moisture ingression. This may lead to a high concentration of electrical stress at the particular location and ultimately voltage breakdown through the insulation medium. Should this occur during a critical period, such as during a peak load for a utility or a critical manufacturing process for a manufacturing concern, the repercussions in terms of financial losses and customer inconveniences can be quite severe.

As stated above, users of expensive medium or high voltage electrical equipment (e.g., medium voltage power cables, switchgears, transformers, electrical motors, generators, etc.) incur extraordinary expenses when power equipment unexpectedly fails. Scheduled maintenance plans are one approach to combat this ongoing problem. However, scheduled maintenance plans cause users to incur unnecessary costs when equipment is found to be functioning satisfactorily after the scheduled maintenance. Therefore, diagnostic systems have been developed that have the ability to predict failures in medium voltage power cable, switchgears, transformers, etc., and thus, enables the equipment user to utilize condition-based maintenance techniques to avert such unexpected failures and associated high costs. Some diagnostic systems attempt to identify any defect that would result in a system failure and predict the time required for these defects to induce the failure in one or more components of the system.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with aspects of the present disclosure a system is provided for testing an electrical power system for defects. The electrical power system transmits power at a known frequency. The system comprises a test sensor capable of capacitively coupling to a live power component of the electrical power system. The test sensor is capable of sensing one or more signals transmitted over the electrical power system. The system also includes a data acquisition unit capable of storing the signals sensed by the test sensor and a synchronizing circuit that allows the data acquisition unit to synchronize the storage of the sensed signals to the frequency of the power transmitted over the electrical power system.

In accordance with another aspect of the present disclosure a system is provided for testing a power system component for defects via a live power cable. The power cable transmits power at a known frequency. The system comprises a sensor capable of capacitively coupling to the live power cable, wherein the sensor senses one or more power cable signals transmitted over the power cable, a data acquisition unit capable of storing the power cable signals sensed by the sensor, and a synchronizer having a synchronizing circuit that receives the power cable signals sensed by the sensor and generates a synchronizing trigger signal for use by the data acquisition unit to synchronize the storage of the power cable signals.

In accordance with another aspect of the present disclosure a synchronizer is provided that comprises at least one battery and a synchronizing circuit that is powered by the at least one battery. The synchronizing circuit receives input signals sensed from an insulated power cable, processes the signals, and outputs a reference signal indicative of a characteristic of the power transmitted by the insulated power cable.

DESCRIPTION OF THE DRAWINGS

The foregoing aspects and many of the attendant advantages of this disclosure will become more readily appreciated by reference to the following detailed description, when taken in conjunction with the accompanying drawings, wherein.

DETAILED DESCRIPTION

The detailed description set forth below in connection with the appended drawings where like numerals reference like elements is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the invention to the precise forms disclosed. Similarly, any steps described herein may be interchangeable with other steps, or combinations of steps, in order to achieve the same or substantially similar result.

Embodiments of the present disclosure are generally directed to data acquisition and/or diagnostic testing equipment, and components thereof, for testing insulated power cables, power cable components (e.g., terminations, joints, splices, etc.), power equipment (e.g., switchgears, distribution blocks, generators, electric motors, transformers, etc.), etc., for defects, such as the presence of faults, discharges, etc. Examples of discharges may include internal discharges (e.g., partial discharge (PD), etc.) and external discharges (e.g., coronas, arcing, etc.). As is known in the art, when a discharge occurs, such as PD, high frequency current and voltage pulses emanate from the site of the discharge. With regard to PD, for example, this is typically a symptom of the presence of insulation defects which should be located and assessed. Once the defect is located and assessed, a decision can then be made as to whether the power cable, power equipment, etc., should be repaired or replaced.

Figure 1:
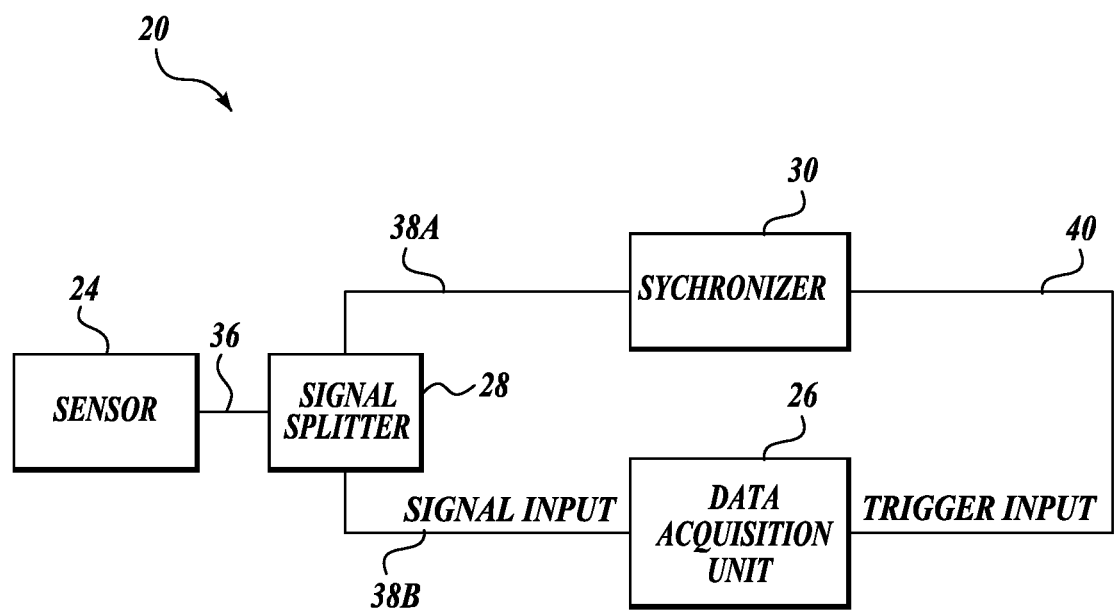
FIG. 1 is a block diagram of one embodiment of a data acquisition system formed in accordance with aspects of the present disclosure.

Referring now to FIG. 1, there is shown a block diagram of one embodiment of a data acquisition system, generally designated 20, formed in accordance with aspects of the present disclosure. The data acquisition system 20 comprises a sensor 24 electrically coupled to a data acquisition unit 26 via a signal splitter 28. In use, the sensor 24 senses one or more signals transmitted over a "live" power cable carrying, for example, 50 Hz or 60 Hz, medium voltage three phase power. The one or more signals are then transmitted to the data acquisition unit 26 to be stored, displayed, and/or analyzed.

Figure 5:
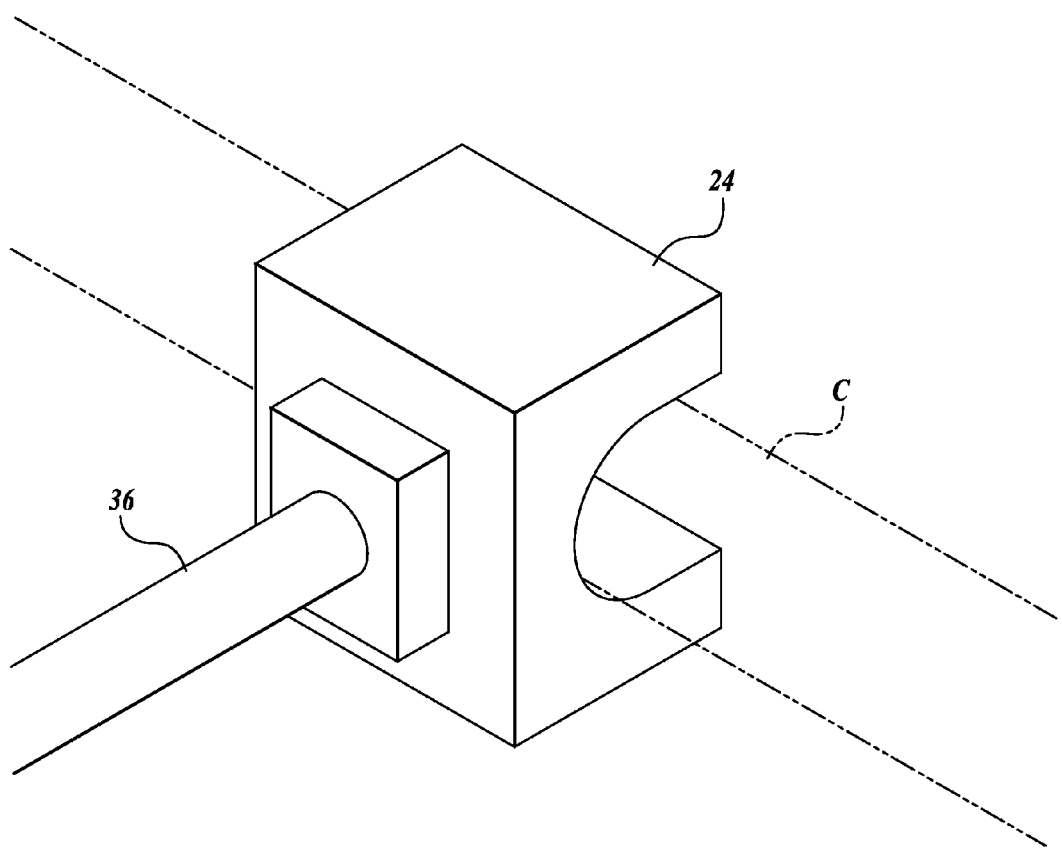
FIG. 5 is a perspective schematic view depicting a sensor formed in accordance with aspects of the present disclosure capacitively coupled to an insulated power cable.

As will be described in more detail below, the system 20 further includes a synchronizer 30 that allows the data acquisition unit 26 to synchronize the storage of the sensed signals to the frequency of the power transmitted over the tested power cable C (FIG. 5). In one embodiment, the synchronizer 30 provides an accurate phase angle reference for accurate phase resolved data acquisition and testing. As used herein, the term "live" or "on-line" means that power is presently being transmitted along the power cable C. It will be appreciated that power cable C may be configured to carry one or more phases (up to three (3) phases) of power to be transmitted between components. For example, power cable C may be configured with a single conductor for carrying only one phase of a three-phase power feed.

Still referring to FIG. 1, the components of the data acquisition system 20 will be described in more detail. In embodiments of the present disclosure, one or more components of the system 20 may be designed and constructed so as to be lightweight, rugged, waterproof, and otherwise resistant to and protective against the relatively harsh operating conditions that would likely be encountered while employed during field tests, including, for example, physical shock or impact; dust or other particulate matter; rain or other moisture or even submersion; and extreme hot or cold temperatures. As such, components, such as the data acquisition unit, the synchronizer, etc., may be integrally or separately housed by a housing that is constructed of an appropriately strong and durable yet lightweight material, such as, for example, high impact plastic, and made substantially sealable against intrusion by particulates and water.

As briefly described above, the sensor 24 of the system 20 senses one or more signals traveling, for example, along one or more power cables over a period a time. The one or more signals sensed by the sensors 24 (hereinafter referred to as "test signals") may include a primary signal component attributable to the frequency of the power transmitted thereover, a secondary signal component attributable to faults, discharges, or other defects caused by, for example, the power cable, power equipment coupled to the power cable, the connections between the power cable and the power equipment, etc., and tertiary signal components attributable to noise, interference, etc. The sensor 24 may be a portable sensor for in-field data acquisition and/or testing or may be fixed in place. In the embodiment shown in FIG. 5, the sensor 24 is a portable, capacitive signal probe, such as a U-shaped metallic (e.g., copper, etc.) probe.

In use, the sensor 24 is capacitively coupled to the power cable C at a position, for example, in proximity to where the power cable is terminated (e.g., a switchgear, an electrical motor, a transformer, a distribution block, etc.). In that regard, the sensor 24 may sense test data indicative of faults, discharges, etc., relating to either the power cable C or to power equipment connected to a circuit employing the power cable C. The sensor 24 may be positioned in other suitable places for sensing test signals from the power cable, such as along a portion of the span in proximity to a splice. Once coupled to the live power cable, the sensor 24 is capable of obtaining test signals and transmitting the test signals to the data acquisition unit 26 via the signal splitter 28 for displaying, processing, and/or storage, etc.

Still referring to FIG. 1, the signal splitter 28 is electrically connected to sensor 24 via signal cable 36, to the synchronizer 30 via signal cable 38A, and to the data acquisition unit 26 via signal cable 38B. In use, the signal splitter 28 receives the one or more test signals from the sensor 24 and splits the test signals into two, discrete test signals of substantially equal bandwidth. The test signals are then transmitted to the data acquisition unit 26 and the synchronizer 30.

In one embodiment, the signal splitter 28 may contain circuitry for splitting the test signals between two frequency bands, and therefore, may be referred to as a band splitter. In this embodiment, the signal splitter receives the one or more test signals from the sensor 24 and splits the test signals into two discrete signals having different frequency bands. For example, the signal splitter may be configured to split or separate the test signal components into a first group of test signal components having frequencies below, for example, 100 KHz and a second group of test signals components having frequencies above, for example, 300 KHz. In this way, the primary signal component attributable to the power frequency can be separated from the secondary signal components attributable to faults, discharges, or other defects caused by, for example, the power cable, power equipment coupled to the power cable, the connections between the power cable and the power equipment, etc. In this embodiment, the first group of test signals is transmitted to the synchronizer 30 and the second group of test signal components is transmitted to the data acquisition unit 26. It will be appreciated that the tertiary components attributable to noise, interference, etc., may be appropriately split between the first and second groups according to their frequency characteristics. It will be appreciated that the frequency bands stated above are just one example of a number of suitable frequency bands that may be practiced with embodiments of the present disclosure. It will be further appreciated that the signal splitter can be configured to carry out further filtering and/or processing, if desired.

Figure 2:
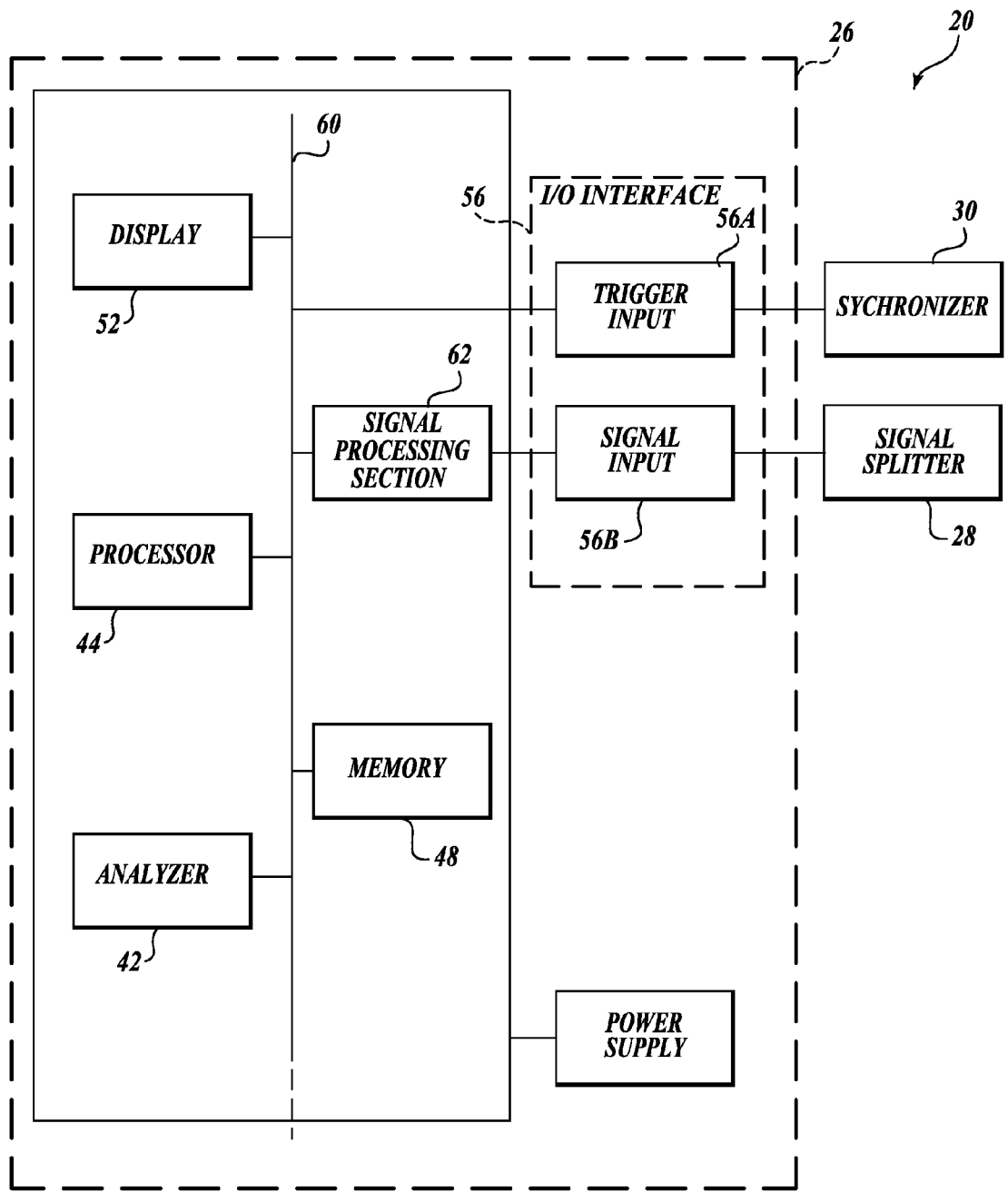
FIG. 2 is a block diagram of one embodiment of a data acquisition unit formed in accordance with aspects of the present disclosure.

Turning now to FIG. 2, there is shown a block diagram of one embodiment of the data acquisition unit 26 formed in accordance with aspects of the present disclosure. The data acquisition unit 26 comprises an analyzer 42, a processor 44, a memory 48, a display 52, and an I/O interface 56 suitably interconnected via one or more buses 60. The memory 48 may include read only memory (ROM), such as programmable ROM (PROM), an erasable programmable ROM (EPROM), and an electrically erasable PROM (EEPROM), etc., random access memory (RAM), and storage memory, such as a solid state hard drive, a hard drive disc, flash memory, etc. The storage memory provides non-volatile storage of computer readable instructions, data structures, program modules, and data received from the sensors 24. As used herein, the term processor is not limited to integrated circuits referred to in the art as a computer, but broadly refers to a microcontroller, a microcomputer, a microprocessor, a programmable logic controller, an application specific integrated circuit, and other programmable circuits, among others.

The memory 48 depicted in FIG. 2 is one example of computer-readable media suited to store data and optional program modules for implementing aspects of the present disclosure. As used herein, the term "computer-readable media" includes volatile and non-volatile and removable and non-removable memory implemented in any method or technology capable of storing information, such as computer-readable instructions, data structures, program modules, or other data.

The data acquisition unit 26 may further include an analyzer 42 for analyzing the test signals received from the sensor 24 for displaying on the display 52. The analyzer 42 may be an analog analyzer that analyzes the signals in a time domain, a digital analyzer that converts the signals from the time domain to a frequency domain, or an analog/digital hybrid analyzer. In one embodiment, the analyzer 42 may be a digital spectrum analyzer that converts the signals from the time domain into the frequency domain by applying a transform, such as a Fast Fourier Transform (FFT). The signals may then be displayed on the display 52. In one embodiment, the foregoing components of the unit 26 may be housed, for example, in a unitary handheld or hand carried device.

In use, the test signals sensed by the sensor 24 are received by the signal splitter 28 and then transmitted to the data acquisition unit 26 via signal cable 38B (FIG. 1), where they are received by signal input 56B of the I/O device 56 (FIG. 2). The I/O interface 56 then transmits the received test signals to the processor 44, which receives the test signals, optionally processes the test signals, and stores such signals in the memory 48 for further analysis. In one embodiment, as will be described in more detail below, the processor 44 also receives one or more synchronization signals, for example, a phase reference signal, and based on the reception of the synchronization signal, is programmed to synchronize the storage of the test signals to the frequency of the power transmitted over the power cable C. The processor 44 may also transmit the signals to the analyzer 42 for displaying the signals on the display 52.

It will be appreciated that the signals received at the signal input 56B may be processed by signal processing section 62 prior to arriving at the processor 44 and/or analyzer 42. For example, the signals may be conditioned by a bandpass filter and analog-to-digital converted by an A/D converter. In one embodiment, the bandpass filter conditions the test signals such that signals having a frequency of between 1 MHz and 200 MHz pass through for further processing, displaying, and/or storing, etc. In this way, the power frequency signal component as well as other unwanted frequency signal components will be removed if present from the test signals so as to ease the recognition of, for example, the PD signal component or other signal components indicative of faults, discharges, etc., potentially present in the signal during subsequent analysis the stored signals.

In accordance with aspects of the present disclosure, the system 20 shown in FIG. 1 further includes a synchronizer 30 that allows the test signals stored by the data acquisition unit 26 to be synchronized to the frequency of the sinusoidal power transmitted in the power cable C. In one embodiment, the synchronizer 30 provides one or more trigger signals to the data acquisition unit so that the data acquisition unit 26 can synchronize the storage of the test signals. For example, the synchronizer 30 is capable of providing a phase angle reference signal as the trigger signal to the data acquisition unit 26 for accurate phase resolved data acquisition and testing. In that regard, the synchronizer 30 receives the test signals from the signal splitter 28 via signal cable 38A, processes the test signals, and transmits phase accurate trigger signals to the trigger input 56A of the I/O interface 56 (See FIG. 2) of the data acquisition unit 26 via signal cable 40. In response to receiving the trigger signals, the processor of the data acquisition unit 26 is capable of synchronizing the storage of the test signals in its memory.

Figure 3:
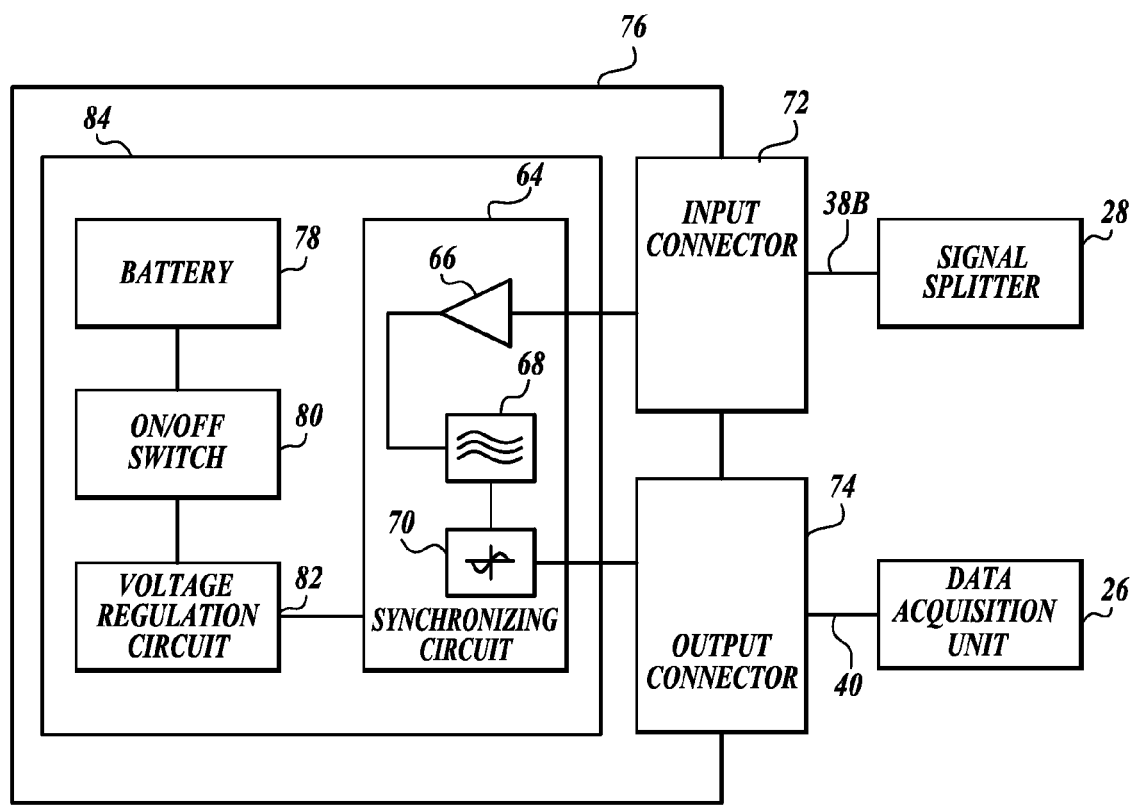
FIG. 3 is a block diagram of one embodiment of a synchronizer formed in accordance with aspects of the present disclosure.
Figure 6:
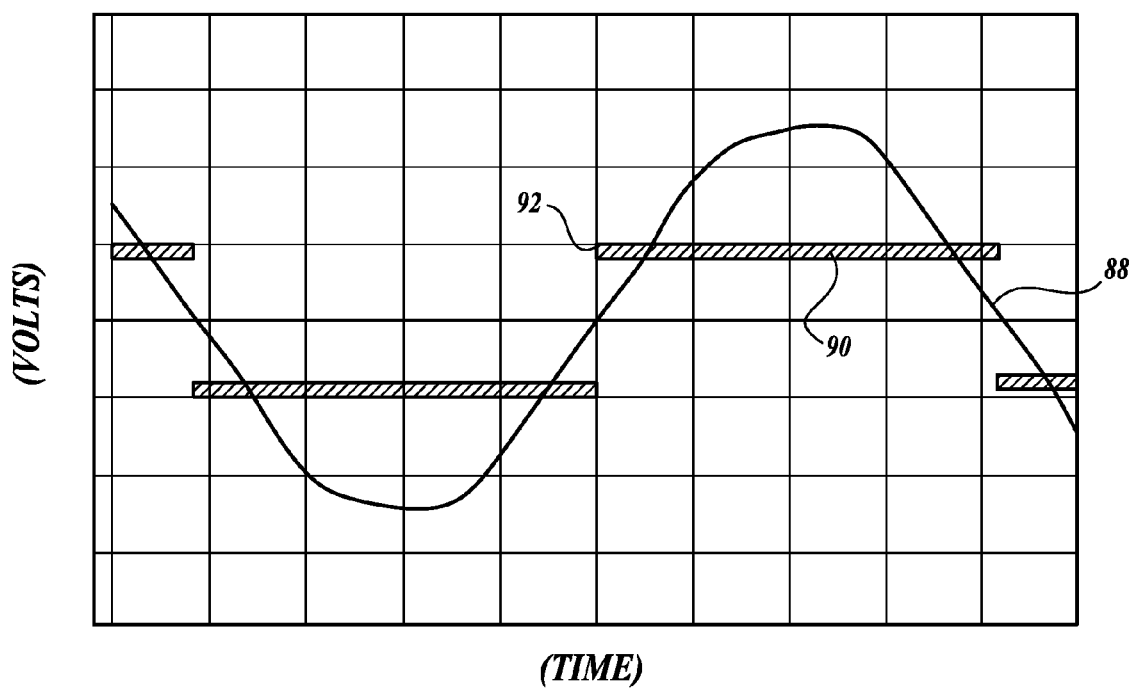
FIG. 6 is a graph depicting one example of a bandpass filtered sinusoidal power signal that is inputted into a zero cross detector, and the corresponding output, or square wave, of the zero cross detector.

Turning now to FIG. 3, there is shown one embodiment of the synchronizer 30 formed in accordance with aspects of the present disclosure. As best shown in the embodiment of FIG. 3, the synchronizer 30 includes a synchronizing circuit 64 comprised of, for example, an amplifier 66, a filter 68, and a zero crossing detector 70. In use, the test signals (or test signal components) outputted by the signal splitter 28 are received by the synchronizer 30 at input connector 72, and passed to the synchronizing circuit 64, where the signals are amplified by amplifier 66, bandpass filtered by the filter 68, and inputted into the zero cross detector 70. In one embodiment, the amplifier 66 may limit the frequency response of the amplified test signal to between 10 Hz and 50 KHz. The bandpass filter 68 to be chosen corresponds to the frequency of the power transmitted over the power cable C. For example, in regions that use 60 Hz power, a 60 Hz bandpass filter (having a width, for example, of about 2 Hz) would be used. The bandpass filtered signal then enters the zero cross detector 70, which determines the transitions through zero volts of the sinusoidal bandpass filtered input signal, and outputs phase accurate trigger signals at output connector 74 to be transmitted via signal cable 40 to the data acquisition unit 26. In one embodiment, the zero cross detector 70 converts the inputted sine wave 88 into a square wave 90 and generates a trigger signal based on the rising edge 92 of the square wave 90, as best shown in FIG. 6. The trigger signal based on the rising edge 88 is indicative of a zero degree phase. Upon receipt of the trigger signal at the trigger input 56A of the unit 26, the processor 44 begins to store phase resolved signal data in memory 48 for future analysis.

In one embodiment, the synchronizer 30 may be configured as a portable unit that is sized to be carried by hand by a technician and powered by one or more batteries 78 (e.g., 6-12 VDC). In that regard, the synchronizer 30 may include a protective housing 76 that envelops the electrical circuitry thereof. The housing 76 can be constructed of any suitable lightweight but durable material, such a plastic. The housing 76 can be a generally box-like shape, although other shapes may be practiced with embodiments of the present disclosure. To supply power from the one or more batteries 78 to the synchronizing circuit 72, the synchronizer 30 may further include an on/off switch 80 and a voltage regulation circuit 82. In one embodiment, the voltage regulation circuit 82 and the synchronizing circuit 72 may be mounted on a circuit board 84 housed within the housing 76.

Figure 4:
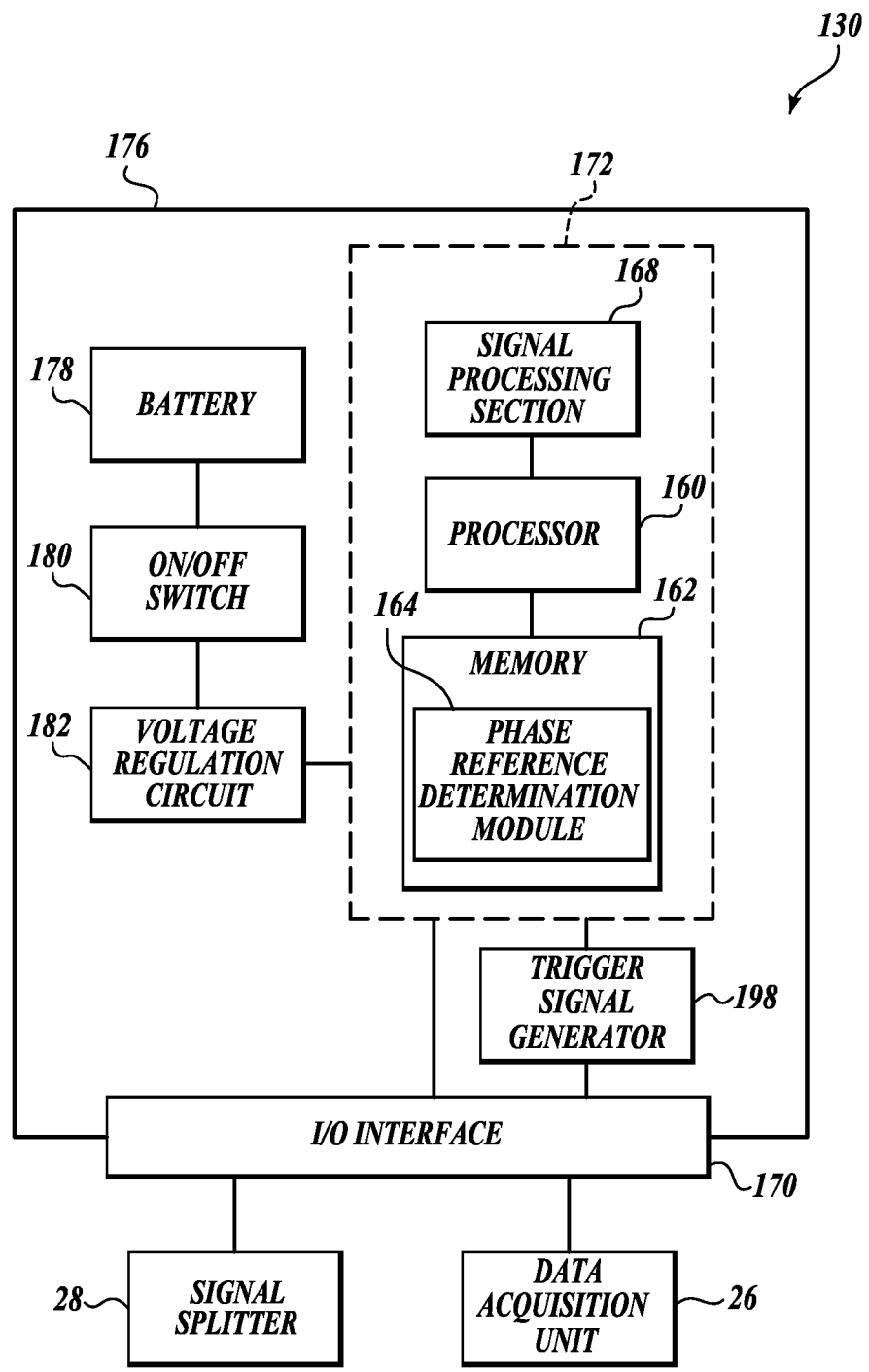
FIG. 4 is a block diagram of another embodiment of a synchronizer formed in accordance with aspects of the present disclosure.

While the synchronizing circuit 72 has been described above as analog circuitry for carrying out the above-described functions, digital circuitry or a combination of analog and digital circuitry may also be used. In that regard, referring now to FIG. 4, there is shown a block diagram of another embodiment of a synchronizer 130 formed in accordance with the present disclosure. As best shown in FIG. 4, the synchronizing circuit 172 of the synchronizer 130 may include a processor 160, a memory 162, and a signal processing section 168 suitably interconnected via one or more communication buses. As further depicted in FIG. 4, the synchronizer 130 also include an I/O interface 170 for interfacing with, for example, the sensor 24 and the data acquisition unit 26, and a trigger signal generator 198. It will be appreciated that the signals received at the processor 160 may be processed by signal processing section 168. For example, the signals may be conditioned by a bandpass filter, anti-alias filter, etc., and are analog-to-digital converted by an A/D converter. Additionally, it will be appreciated that the trigger signal generator 198 may be part of the synchronizing circuit 172 or separate therefrom.

Those skilled in the art and others will recognize that the processor 160 serves as the computational center of the synchronizer 130 by supporting the execution of logic, instructions, etc. either programmed into the processor or available from the memory 162. As such, the logic described herein may be implemented in hardware, in software, or a combination of hardware and software.

The memory 162 depicted in FIG. 4 is one example of computer-readable media suited to store data and optional program modules for implementing aspects of the present disclosure. The memory 162 may include read only memory (ROM), such as programmable ROM (PROM), an erasable programmable ROM (EPROM), and an electrically erasable PROM (EEPROM), etc., random access memory (RAM), and storage memory, such as a solid state hard drive, a hard drive disc, flash memory etc. The storage memory provides non-volatile storage of computer readable instructions, data structures, program modules, etc.

A number of program modules, such as application programs, may be stored in memory 162, including a phase reference determination module 164. The phase reference determination module 164 includes logic that instructs the processor 160 to determine the phase of the power transmitted over the electrical power system from the test signals, and in particular, the phase of the power transmitted over the power cable to which the sensor 24 is coupled. The logic of the phase reference determination module 164 further instructs the processor 160 to signal the trigger signal generator 198 to generate phase accurate trigger signals for output to the data acquisition unit 26 via signal cable 40. In one embodiment, the processor, via instructions from the module 164, signals the trigger signal generator 198 when the sinusoidal power signal component of the signal has a zero degree phase.

Figure 7:
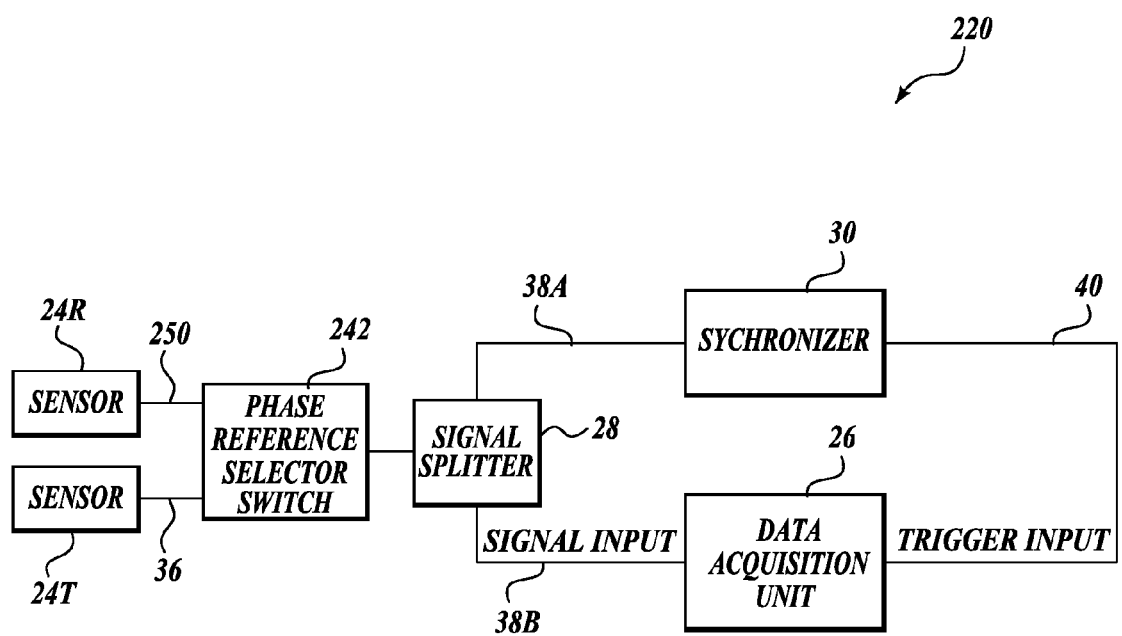
FIG. 7 is a block diagram of another embodiment of a data acquisition system formed in accordance with aspects of the present disclosure.

Turning now to FIG. 7, there is shown a block diagram of another embodiment of a data acquisition system, generally designated 220, formed in accordance with aspects of the present disclosure. The data acquisition system 220 is substantially similar in construction, materials, and operation as the data acquisition system 20 of FIG. 1 except for the differences that will now be explained in detail. As best shown in FIG. 7, the system 220 further includes an operator activated phase reference selector switch 242. The phase reference selector switch 242 switches between a first input that is connected to the signal cable 36 and receives test signals sensed by the testing sensor 24T, and a second input that is connected to a signal cable 250 and receives reference signals sensed by an additional sensor, referred to as the power phase reference sensor 24R. The phase reference selector switch 242 outputs either the test signals or reference signals to the synchronizing circuit 272 via the signal splitter 28. Accordingly, the operator can choose to measure the frequency and/or the phase of the power transmitted over a power cable with either the test sensor 24T or the reference sensor 24R, depending on the position of the phase reference selector switch 242.

In one embodiment, the reference sensor 24R can be capacitively coupled to a preselected insulated power cable at a specific location while the test sensor 24T is used to sense test data at any number of local power system test points. For example, in embodiments where a plurality of insulated power cables terminate at a power equipment component, the reference sensor 24R may be capacitively coupled to one of the power cables. The test sensor 24T may then be capacitively coupled, one at a time, to the other power cables for obtaining test data relating to each power cable. In this manner, all of the test points are recorded using a single phase reference. This will aid in the analysis when determining the source of the discharge signals.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A system for testing an electrical power system for defects, the electrical power system transmitting power at a known frequency, comprising:
    a data acquisition unit;
    a synchronizing circuit coupled to the data acquisition unit;
    a signal splitter separately coupled to each of the synchronizing circuit and the data acquisition unit; and
    a capacitive test sensor coupled to the signal splitter and capacitively coupleable to a live power component of the electrical power system, wherein:
        the capacitive test sensor is configured to sense one or more signals transmitted over the electrical power system, to generate test signals based on the sensed one or more signals, and to send the test signals to the signal splitter;
        the signal splitter is configured to send at least a first portion of the test signals to the synchronizing circuit and to send at least a second portion of the test signals to the data acquisition unit separately from sending the first portion of the test signals to the synchronizing circuit;
        the synchronizing circuit is configured to generate trigger signals based on the first portion of the test signals received from the signal splitter and to send the trigger signals to the data acquisition unit; and
        the data acquisition unit is configured to receive the second portion of the test signals from the signal splitter independently of receiving the trigger signals from the synchronizing circuit and to synchronize storage of the second portion of the test signals to a frequency of the power transmitted over the electrical power system based on the trigger signals received from the synchronizing circuit.

2. The system of claim 1, wherein the trigger signals comprise a phase accurate reference signal.

3. The system of claim 2, wherein the phase accurate reference signal is indicative of a zero degree phase.

4. The system of claim 2, wherein the phase accurate reference signal allows for the storage of phase resolved partial discharge data.

5. The system of claim 1, wherein the synchronizing circuit causes the data acquisition unit to synchronize the storage of the sensed signals based on reception of one or more signals from a reference sensor.

6. The system of claim 1, further comprising:
a reference sensor capable of capacitively coupling to a live power component of the electrical power system, the reference sensor sensing one or more signals transmitted over the electrical power system; and
a selector switch electrically connected between the synchronizing circuit and both the reference sensor and the test sensor, wherein the selector switch has a first position in which signals from the reference sensor are transmitting to the synchronizing circuit and a second position in which signals from the test sensor are transmitting to the synchronizing circuit.

7. The system of claim 1, wherein the test sensor senses electromagnetic signals.

8. The system of claim 1, wherein the synchronizing circuit includes a bandpass filter having a bandpass value substantially equal to the known frequency of the power transmitted over the power system.

9. The system of claim 8, wherein the synchronizing circuit includes a zero crossing detector that receives the bandpass filtered signal from the band pass filter.

10. The system of claim 1, wherein the synchronizing circuit is battery powered.

11. The system of claim 1, wherein the live electrical power component is a power cable.

12. The system of claim 1, wherein the synchronizing circuit includes an amplifier configured to amplify the first portion of the test signals.

13. A system for testing a power system component for defects via a live insulated power cable, the power cable transmitting power at a known frequency, comprising:
a capacitive test sensor capable of capacitively coupling to the live power cable, the sensor configured to generate test signals based on one or more power cable signals transmitted over the power cable;
a data acquisition unit coupled to the capacitive test sensor, wherein the data acquisition unit is configured to receive at least a first portion of the test signals from the test sensor; and
a synchronizer discrete from but coupled to the capacitive test sensor and the data acquisition unit, wherein the synchronizer comprises:
a portable housing;
an input connector carried by the portable housing and coupled to the capacitive test sensor, wherein the synchronizer is configured to receive at least a second portion of the test signals from the test sensor via the input connector, wherein the second portion of the test signals is sent to the synchronizer separately from the first portion of the test signals sent to the data acquisition unit;
an output connector carried by the portable housing and coupled to the data acquisition unit;
at least one battery disposed in the portable housing; and
a synchronizing circuit disposed in the portable housing and powered by the at least one battery, wherein the synchronizing circuit is configured to provide one or more trigger signals based on the second portion of the test signals received via the input connector, and wherein the synchronizer is configured to output the one or more trigger signals via the output connector;
wherein the data acquisition unit is configured to receive the first portion of the test signals independently of receiving the trigger signals from the synchronizer and to synchronize storage of the first portion of the test signals received from the test sensor based on the one or more trigger signals received from the synchronizer.

14. The system of claim 13, wherein the one or more trigger signals are indicative of the phase angle of the power transmitted by the insulated power cable.

15. The system of claim 14, where the phase angle is a zero degree phase.

16. The system of claim 13, wherein the synchronizing circuit includes:
an amplifier configured to receive the second portion of the test signals and amplify the second portion of the test signals;
a bandpass filter configured to receive the amplified signals and filter the amplified signals; and
a zero cross detector configured to receive the amplified bandpass filtered signals and generate the one or more trigger signals.

17. The system of claim 16, wherein the bandpass filter is selected based on the power frequency component of the second portion of the test signals.

18. The system of claim 13, wherein the synchronizing circuit includes a processing unit programmed to determine the phase angle of the second portion of the test signals.

19. The system of claim 18, wherein the processing unit is programmed to cause the generation of the one or more trigger signals upon the determination of a zero degree phase angle.

* * * * *